United States Patent
Cross et al.

(10) Patent No.: US 6,555,864 B1
(45) Date of Patent: *Apr. 29, 2003

(54) FERROELECTRIC CAPACITOR HAVING A PZT LAYER WITH AN EXCESS OF PB

(75) Inventors: Jeffrey Scott Cross, Kawasaki (JP); Tsuyoshi Sakai, Kawasaki (JP); Mitsushi Fujiki, Kawasaki (JP); Mineharu Tsukada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/515,524

(22) Filed: Feb. 29, 2000

(30) Foreign Application Priority Data

Mar. 4, 1999  (JP) .......................... 11-057601

(51) Int. Cl.$^7$ ...................... H01L 27/108; H01L 31/119
(52) U.S. Cl. .................. 257/310; 257/306; 257/532
(58) Field of Search .................. 257/310, 311, 257/296, 295, 532, 297–309; 438/240

(56) References Cited

U.S. PATENT DOCUMENTS

| | | | | |
|---|---|---|---|---|
| 6,011,285 A | * | 1/2000 | Hsu et al. | 257/295 |
| 6,015,990 A | * | 1/2000 | Hieda et al. | 257/310 |
| 6,194,228 B1 | * | 2/2001 | Fujiki et al. | 438/3 |
| 6,239,461 B1 | * | 5/2001 | Lee | 257/306 |
| 6,274,388 B1 | * | 8/2001 | Aggarwal et al. | 438/3 |
| 6,284,654 B1 | * | 9/2001 | Roeder et al. | 438/681 |
| 6,392,265 B2 | * | 5/2002 | Kondo et al. | 257/295 |

FOREIGN PATENT DOCUMENTS

| | | |
|---|---|---|
| JP | 08335672 A | 12/1996 |
| JP | 11233733 A | 8/1999 |
| JP | 2000208725 A | 7/2000 |
| JP | 2000252441 A | 9/2000 |

OTHER PUBLICATIONS

I. M. Reaney "Microelectronic Engineering 29" (1995)—pp. 277–284.
M. Hrovat. et al. "Journal of Materials Science Letters 13" (1994)—pp. 1406–1407.
S. D. Traynor, et al. "Intergrated Ferroelectric 16", (1997)—pp. 63–78.
D. J. Taylor, et al. "Thin Solid Films 263" (1995)—pp. 221–230.
Jpn. J. appl. Phys. vol. 36 (1997) pp. L690–L692, Part 2, No.6A, Jun. 1, 1997, "Characterization of a Sol–Gel Derived Pb(Zr, Ti)O$_3$ Thin–Film Capacitor With Polycrystalline SrRuO$_3$ Electrodes", K. Aoki et al.

* cited by examiner

Primary Examiner—Tom Thomas
Assistant Examiner—Douglas W. Owens
(74) Attorney, Agent, or Firm—Armstrong, Westerman & Hattori, LLP

(57) ABSTRACT

A ferroelectric capacitor includes a lower electrode, a ferroelectric capacitor insulation film formed on the lower electrode and an upper electrode formed on the ferroelectric capacitor insulation film, wherein the ferroelectric capacitor insulation film has a composition of PZT and contains an excess amount of Pb with respect to a stoichiometry of PZT.

8 Claims, 11 Drawing Sheets

FERROELECTRIC CAPACITOR HAVING A PZT LAYER WITH AN EXCESS OF PB

CROSS-REFERENCE TO RELATED APPLICATION

The present application is based on Japanese priority application No.11-57601 filed on Mar. 4, 1999, the entire contents of which are hereby incorporated by reference.

BACKGROUND OF THE INVENTION

The present invention generally relates to semiconductor devices and more particularly to the fabrication process of a semiconductor memory device having a ferroelectric film.

Semiconductor memory devices such as DRAMs or SRAMs are used extensively in various information processing apparatuses including computers as a high-speed main memory. On the other hand, DRAMs or SRAMs are volatile in nature and the information held therein is lost when the electric power is turned off. Thus, in order to store programs or data, conventional computers or other information processing apparatuses have used a magnetic disk device as a large-capacity, non-volatile storage device.

A magnetic disk device, however, has a drawback in that it is bulky and mechanically fragile. Further, there are additional drawbacks such as large power consumption and slow access speed.

In view of the foregoing various drawbacks of magnetic disk devices, there is a proposal to use a semiconductor non-volatile memory device such as EEPROM or flash memory as the non-volatile storage device of computers. An EEPROM or a flash memory has a floating gate electrode and stores information in the floating gate electrode in the form of electric charges. Particularly, a flash-memory has a cell structure similar to that of a DRAM and is suitable for use in constructing a large-scale integrated circuit.

Meanwhile, such EEPROM or flash memory has a drawback in that it takes time to write information into the memory device, as the writing of information is achieved by injection of hot electrons into the floating gate electrode through a tunneling insulation film. Further, there arises a problem that the tunneling insulation film becomes deteriorated when reading or writing of information is conducted repeatedly. When the tunneling insulation film has become deteriorated, writing or erasing of information becomes unreliable.

On the other hand, there is a different type of semiconductor non-volatile memory device called ferroelectric semiconductor memory (FeRAM), in which information is stored in a ferroelectric film in the form of spontaneous polarization. An FeRAM includes a single MOSFET as a memory cell transistor and a memory cell capacitor similar to a conventional DRAM, except that the dielectric film in the memory cell capacitor is replaced with a ferroelectric film such as PZT (Pb(Zr,Ti)$O_3$), PLZT(Pb(Zr,Ti,La)$O_3$), BST ((Ba,Sr)Ti$O_3$) or SBT(SrBi$_2$Ta$_2$O$_3$). Thus, an FeRAM has a structure suitable for constructing a large-scale integrated circuit with a high integration density.

As noted above, writing of information is achieved in an FeRAM by controlling the spontaneous polarization of the ferroelectric capacitor, wherein the control of the spontaneous polarization is achieved by applying an electric field to the ferroelectric film constituting the ferroelectric capacitor. Thus, an FeRAM has an inherently high operational speed, which is faster than an EEPROM or a flash memory, in which writing is achieved by injection of hot-electrons, by a factor of 1,000 or more. Further, the electric power consumption is reduced by a factor of about ⅟10 in an FeRAM. Furthermore, an FeRAM, not using a tunneling insulation film, has an advantageous feature of long lifetime, longer than a flash memory by a factor of 10,000.

FIG. 1 shows the construction of a conventional FeRAM.

Referring to FIG. 1, an FeRAM 10 is constructed on a p-type Si substrate 11, on which an active region is defined by a field oxide film 12. The active region is covered by a gate oxide film not designated in FIG.1 by a reference numeral, and a gate electrode 13 is provided on the gate oxide film in corresponding to a word line of the FeRAM. Further, diffusion regions 11A and 11B of the n$^+$-type are formed in the substrate 11 at both lateral sides of the gate electrode 13 as source and drain regions of the memory cell transistor. In the substrate 11, a channel region is formed between the foregoing diffusion regions 11A and 11B.

It should be noted that the gate electrode 13 is covered by a CVD-oxide film 14 deposited on the substrate 11 so as to cover the active region, and the CVD-oxide film 14 in turn is covered by a planarizing interlayer insulation film 15. The interlayer insulation film 15 is formed with a contact hole 15A exposing the diffusion region 11B, and a WSi plug 16 is formed such that the WSi plug 16 fills the contact hole 15A.

Further, an adhesion layer of Ti/TiN structure (not shown) is formed on the interlayer insulation film 15 including the part where the plug 16 is exposed, and a lower electrode 17 of Pt, and the like, is formed on the adhesion layer thus formed. Further, a ferroelectric film 18 of PZT or PLZT is formed on the lower electrode 17, and an upper electrode 19 of Pt is formed on the ferroelectric film 18.

The lower electrode 17, the ferroelectric film 18 and the upper electrode 19 form together a ferroelectric capacitor C, wherein the ferroelectric capacitor is covered by a CVD-oxide film 21 including a side wall part thereof, and an interconnection pattern 20 makes an electrical contact with the upper electrode 19 via a contact hole formed in the CVD-oxide film 21. Further, the entirety of the ferroelectric capacitor C is covered by an interlayer insulation film 22.

The interlayer insulation film 22 includes a contact hole 22A exposing the diffusion region 11A, and a bit line pattern 23 of Al or an Al-alloy is formed on the interlayer insulation film 22 so as to make an electrical contact with the diffusion region 11A at the contact hole 22A.

FIG. 2 shows a unit cell of a PZT crystal used in the FeRAM 10 of FIG.1 as the ferroelectric film 18.

Referring to FIG. 2, the crystal of PZT has a perovskite structure, which is characterized by a phase transition in which a Ti or Zr atom occupying the site coordinated by O atoms undergoes a displacement in the direction of the c-axis. Thereby, the direction of the displacement depends on the direction of the external electric field applied to the PZT crystal, and thus, the PZT crystal exhibits a spontaneous polarization as represented in FIG. 3. Thus, by applying a predetermined writing voltage across the lower electrode 17 and the upper electrode 19, it is possible to reverse the polarization of the PZT crystal constituting the ferroelectric film 18. In other words, it is possible to write desired binary information into the ferroelectric film 18 by applying such a predetermined writing voltage.

When reading out the binary information thus written into the FeRAM 10 of FIG. 1, the word line, and hence the gate electrode 13 of the memory cell transistor, is activated, and the voltage appearing at the bit line electrode 23 as a result of conduction of the channel region, is detected.

Referring to the hysteresis loop of FIG. 3, the height of the loop at the zero electric field strength is called the switching electric charge $Q_{SW}$. The larger the value of the quantity $Q_{SW}$, the better the reliability of information retention in the FeRAM 10. Further, the electric field necessary for wiring information into the FeRAM 10 decreases with increasing values of $Q_{SW}$. Thereby, the FeRAM 10 can be driven at a low voltage. Thus, in the FeRAM 10 of FIG. 1, it is desired to maximize the value of $Q_{SW}$ of the ferroelectric film 18.

In order to obtain the spontaneous polarization represented in FIG. 3 for the FeRAM 10 of FIG. 1, it is necessary to crystallize the ferroelectric film 18 in an oxidizing atmosphere at the temperature of at least 600° C. Thus, it has been practiced to form the lower electrode 17 by a refractive metal such as Pt, which shows a low reactivity against $O_2$ and maintains a low resistivity even when processed in such an oxidizing atmosphere. On the other hand, such a lower electrode 17 formed of Pt has a drawback in that it cannot block the diffusion of oxygen atom (O) or Pb effectively, and the ferroelectric film 18 tends to become depleted in Pb or O. In such a non-stoichiometric composition, the ferroelectric film 18 cannot provide the desired spontaneous polarization represented in FIG. 3.

In order to eliminate the foregoing problem, there is a proposal, related to the ferroelectric capacitor C of FIG. 1, to form the lower electrode 17 by a lower electrode film part 17A of $IrO_2$ and an upper electrode film part 17B of Pt as represented in FIG. 4A. Further, there is a proposal as represented in FIG. 4B, in which the upper electrode 19 is formed of a lower electrode film part 19A of $IrO_2$ and an upper electrode film part 19B of Pt formed on the lower electrode film part 19A. In the construction of FIG. 4B, the problem of formation of oxygen defects in the ferroelectric film 18 is effectively eliminated by forming the $IrO_2$ film 19A adjacent to the ferroelectric film 18.

Unfortunately, it is known, in the ferroelectric capacitor C of such a construction, that there occurs a substantial fatigue phenomenon in the ferroelectric film 18 as a result of repetition of polarizing steps, in which and the magnitude of the residual polarization or inversion electric charges $Q_{SW}$ becomes reduced with repetitive polarization steps, thus resulting in the fatigue. It is believed that such a fatigue is caused by the fact that the $IrO_2$ film cannot prevent the oxygen defect formation in the ferroelectric film 18 when the polarizing steps are repeated and possibly the formation of a dielectric phase between $IrO_2$ and PZT.

In the ferroelectric capacitor C of FIG. 4A or 4B, there has been another problem in that it is difficult to obtain a satisfactory imprint performance. The reason for this unsatisfactory result is attributed to the oxygen defect formation in the ferroelectric film 18 which occurs at the interface to the Pt electrode. Further, associated with the miniaturization of the FeRAM, there occurs a problem in that the electric performance of the film 18 is degraded rapidly with decrease in the thickness of the ferroelectric film 18.

In view of the situation noted above, the inventor of the present invention has proposed a ferroelectric capacitor that uses $SrRuO_3$ (SRO) for the upper electrode 19 in the construction of FIG. 1. According to the previous proposal of the inventor, a ferroelectric capacitor having an excellent performance with regard to the fatigue and reliability is obtained. Further, the ferroelectric capacitor maintains an excellent electrical performance even in the case wherein the thickness of the ferroelectric film 18 is reduced.

In order to fabricate such a ferroelectric capacitor that uses $SrRuO_3$ in a form suitable for use in the FeRAM of FIG. 1, it is necessary to establish the art of dry-etching a $SrRuO_3$ film. A process of dry-etching a $SrRuO_3$ film has been established in a conventional RF etcher in the presence of $Cl_2$, Ar and $O_2$ gases.

In the ferroelectric capacitor that uses $SrRuO_3$ for the upper electrode, there has been a further problem in that, while the performance of the capacitor is significantly improved over the conventional ferroelectric capacitor with regard to fatigue, the performance is not yet sufficient for use as a capacitor in a practical semiconductor device.

At present, the mechanism of the foregoing insufficient improvement with regard to the fatigue of the ferroelectric capacitor is not well understood. It is suspected that Sr atoms in the $SrRuO_3$ electrode migrate to the grain boundary of the ferroelectric film such as a PZT film at the time of the annealing process, and the Sr atoms thus migrated cause a further diffusion, at the time of the fatigue test conducted on the ferroelectric capacitor. As a result of the diffusion, there may be formed a conductive channel of a compound such as $SrPbO_3$ in the ferroelectric film. It should be noted that $SrPbO_3$ is a material with a resistance of a semiconductor. When such a semi-conductive channel is formed in the ferroelectric capacitor, the ferroelectric capacitor may undergo a short-circuit.

In the investigation conducted by the inventor of the present invention and constituting the foundation of the present invention, it was discovered that the problem of short-circuit and associated degradation of reliability of the ferroelectric capacitor appears conspicuously when the thickness of the ferroelectric film has exceeded a value of 70 nm.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a ferroelectric capacitor having an upper electrode of a perovskite oxide, wherein the fabrication thereof is substantially facilitated and the performance thereof substantially improved with regard to leakage current, fatigue and imprinting.

Further, the present invention provides a semiconductor device having such a ferroelectric capacitor and a fabrication process thereof.

Another object of the present invention is to provide a ferroelectric capacitor, comprising:
  a lower electrode;
  a ferroelectric capacitor insulation film provided on said lower electrode; and
  an upper electrode provided on said ferroelectric capacitor insulation film, said upper electrode including an oxide layer having a perovskite structure,
  said ferroelectric capacitor insulation film having a composition of PZT,
  wherein said ferroelectric capacitor insulation film contains an excess amount of Pb with respect to a stoichiometry of PZT.

According to the present invention, the amount of Pb existing at the grain boundary of the PZT ferroelectric capacitor insulation film is optimized by adjusting the composition of the PZT film. More specifically, by setting the composition of the PZT film so as to contain an excess amount of Pb with respect to the stoichiometric composition of PZT, the amount of the Pb atoms existing on the grain boundary is also optimized and the Pb atoms thus concentrated on the grain boundary effectively suppress the diffusion of the Sr atoms from the $SrRuO_3$ upper electrode into the PZT capacitor insulation film. Thereby, the performance of the ferroelectric capacitor is improved substantially, particularly with regard to the fatigue characteristic.

Another object of the present invention is to provide a ferroelectric capacitor, comprising:

a lower electrode;

a ferroelectric capacitor insulation film provided on said lower electrode; and an upper electrode provided on said ferroelectric capacitor insulation film, said upper electrode including an oxide layer having a perovskite structure provided on said ferroelectric capacitor insulation film, said oxide layer having a composition of $SrRuO_3$ and a thickness of about 30 nm or less.

According to the present invention, the performance of the ferroelectric capacitor is improved substantially with regard to the fatigue characteristic, by merely interposing a thin layer of $SrRuO_3$ between the PZT ferroelectric capacitor insulation film and the Pt upper electrode as a part of the foregoing upper electrode, wherein the leakage characteristic of the ferroelectric capacitor is improved substantially by setting the thickness of the $SrRuO_3$ layer to be less than about 30 nm. In view of facilitating the dry etching process of the upper electrode that includes a layer of $SrRuO_3$, it is preferable to set the thickness of the $SrRuO_3$ layer as thin as possible for facilitating the dry etching process applied to the upper electrode.

Another object of the present invention is to provide a method of fabricating a ferroelectric capacitor, comprising the steps of:

depositing a lower electrode on a substrate;

forming a ferroelectric capacitor insulation film on said lower electrode;

forming an upper electrode of an oxide layer having a perovskite structure; and applying, after said step of forming said upper electrode, an annealing process at a temperature of about 600° C. or more.

According to the present invention, the fatigue characteristic of the ferroelectric capacitor is improved substantially by conducting the annealing process at the temperature of about 600° C. or more.

Other objects and further features of the present invention will become apparent from the following detailed description when read in conjunction with the attached drawings.

DETAILED DESCRIPTION OF THE INVENTION

[Principle]

In the present invention, the amount of Pb distributed along the grain boundary in the ferroelectric capacitor insulation film is optimized, by adjusting the composition of PZT or PLZT constituting the ferroelectric capacitor insulation film such that the ferroelectric capacitor insulation film contains an excess amount of Pb with respect to the stoichiometric composition of PZT or PLZT. Thereby, the diffusion of Ru atoms from the upper electrode, which contains a layer of $SrRuO_3$, into the ferroelectric capacitor insulation film is effectively blocked by the excess Pb atoms thus distributed along the grain boundary in the ferroelectric capacitor insulation film.

Further, by reducing the thickness of the log $SrRuO_3$ layer in the upper electrode to be about 30 nm or less, the present invention successfully reduces the time of the thermal annealing process needed for crystallizing the $SrRuO_3$ electrode and limits the amount of Sr capable of diffusing into the PZT. Thereby, the diffusion of Sr atoms from the $SrRuO_3$ electrode into the ferroelectric capacitor insulation film is also suppressed.

As a result of such a minimization of the Ru diffusion into the ferroelectric capacitor insulation film from the $SrRuO_3$ upper electrode, the ferroelectric capacitor is improved substantially with respect to the fatigue performance and imprinting performance. A similar effect is obtained also by setting the thickness of the ferroelectric capacitor insulation film to be about 300 nm or less. Further, by reducing the thickness of the $SrRuO_3$ layer in the upper electrode to be about 30 nm or less, the patterning of the $SrRuO_3$ upper electrode by a dry-etching process is substantially facilitated.

Figure 1:
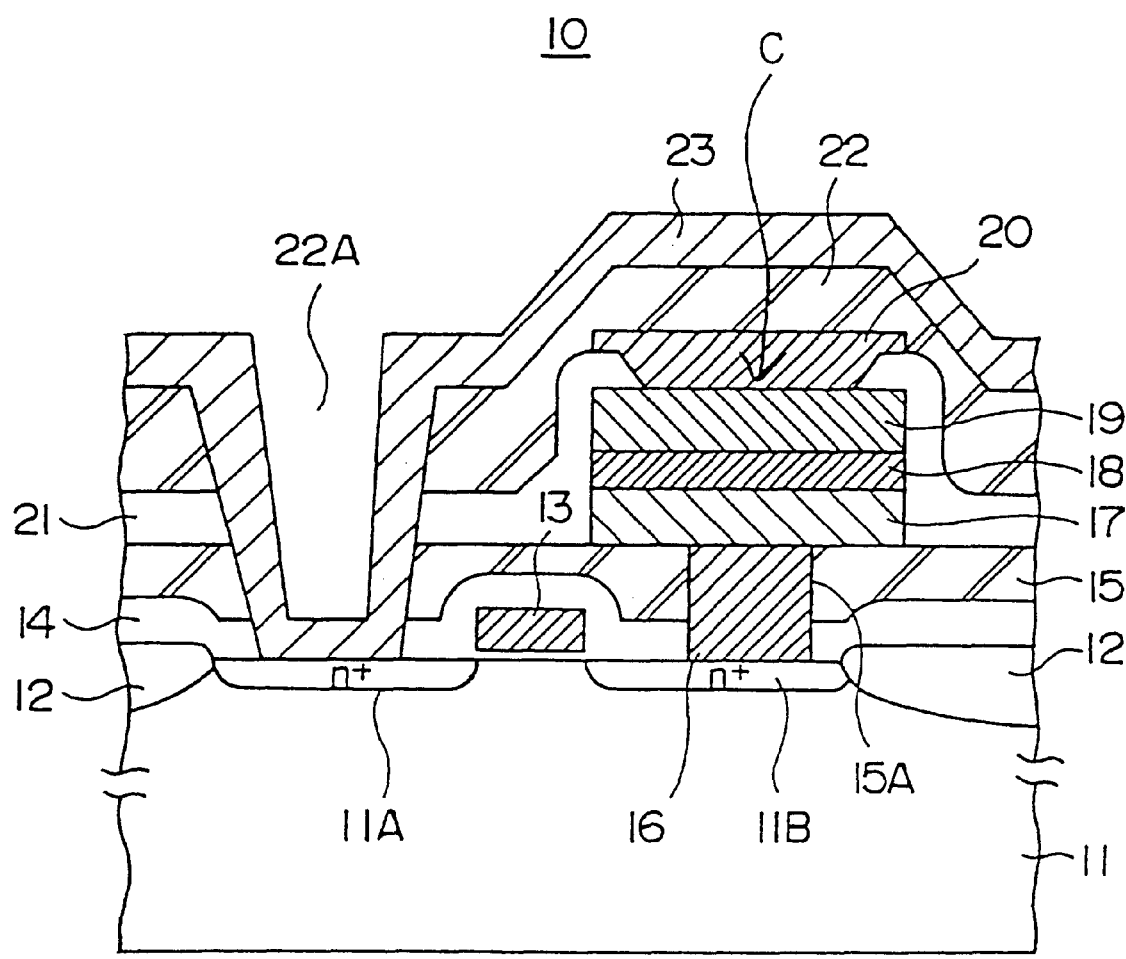
FIG. 1 is a diagram showing the construction of a conventional FeRAM.
Figure 2:
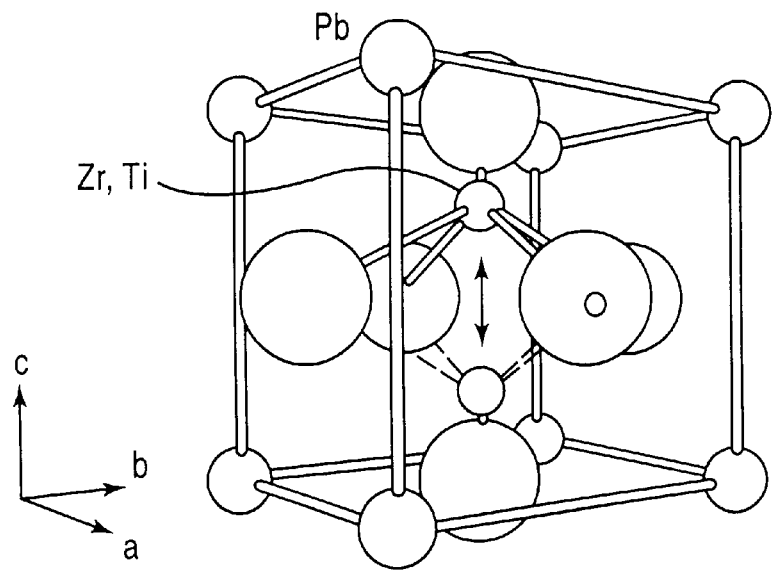
FIG. 2 is a diagram showing the crystal structure of a ferroelectric crystal used in the FeRAM of FIG. 1 as a ferroelectric capacitor insulation film and having a perovskite structure.
Figure 3:
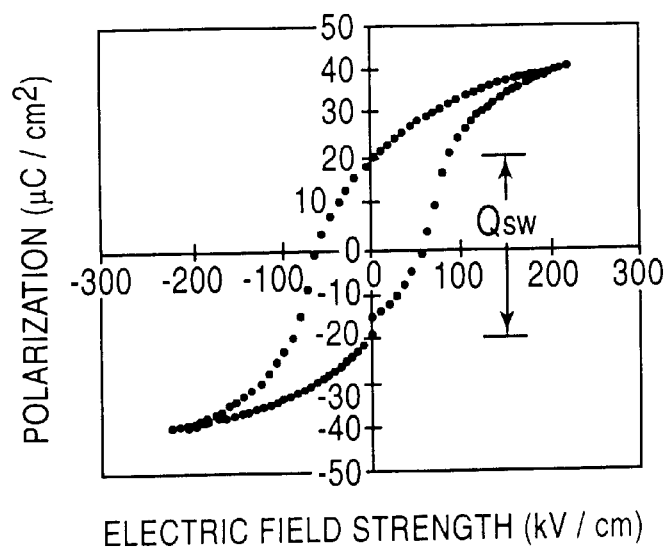
FIG. 3 is a diagram showing the polarization of the ferroelectric crystal of FIG. 2.
Figure 4A:
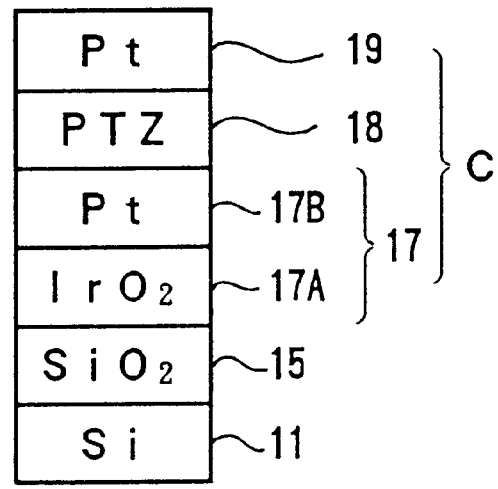
FIGS. 4A and 4B are diagrams showing the construction of other conventional ferroelectric capacitors.
Figure 4B:
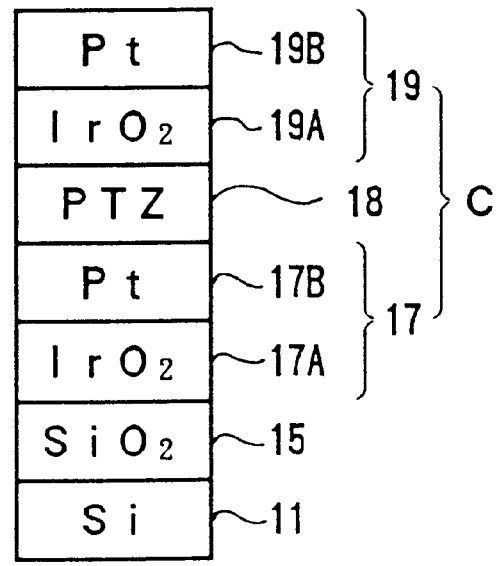
Figure 5:
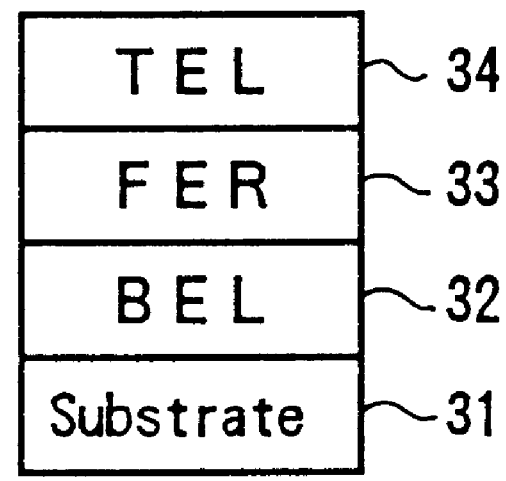
FIGS. 5–9 are diagrams showing the principle of the present invention.

FIG. 5 shows the construction of a ferroelectric capacitor used in the experimental investigation conducted by the inventor of the present invention as the foundation of the present invention.

Referring to FIG. 5, the ferroelectric capacitor is constructed on a Si substrate 31 and includes a lower electrode (BEL; bottom electrode) 32 of a Pt film formed on the Si substrate 31 with a thickness of about 80 nm, a ferroelectric capacitor insulation film (FER; ferroelectric film) 33 of PZT formed on the lower electrode 32, and an upper electrode (TEL; top electrode) 34 formed on the ferroelectric capacitor insulation film 33, wherein the upper electrode 34 is formed of $SrRuO_3$, which is a conductive oxide having a perovskite structure. In the experiments described below, the PZT film 33 was formed with a thickness of about 300 nm and the $SrRuO_3$ film 34 was formed with a thickness of about 30 nm. The PZT film 33 was formed either by a sputtering process or a CSD (chemical solution deposition) process and is crystallized to the perovskite structure by applying a thermal annealing process at the temperature of 550–750° C. The $SrRuO_3$ film 34, on the other hand, was formed by a sputtering process by using a sintered $SrRuO_3$ target.

In the experiment, it should be noted that the ferroelectric capacitor thus formed was further subjected to a thermal annealing process conducted at about 600° C., after the deposition of the $SrRuO_3$ film 34, wherein the $SrRuO_3$ film 34 thus processed undergoes crystallization into the perovskite structure.

TABLE I below summarizes the result of the experiments thus conducted, wherein TABLE I represents the positive and negative leakage currents (LEAK) observed respectively for the case in which a positive voltage of +5V is applied and for the case in which a negative voltage of −5V is applied across the capacitor, the rate of shift or change of the positive and negative coercive voltages (Vc-shift; +Vc and −Vc) after 88 hours, the value of the switching electric charge ($Q_{SW}$), the 90%-saturation voltage $V_{90}$, and the fatigue $\Delta Q_{SW}$, which is the loss of the switching electric charge $Q_{SW}$ observed after a repetition of the voltage pulses for $1\times10^8$ times.

TABLE I

| PZT Pb (%) | TEL Pt/ SRO (nm) | Leak +5/−5 ($\mu Acm^{-2}$) | Vc-shift +Vc(%)−Vc(%) (after 88 hr) | $Q_{SW}$ ($\mu Ccm^{-2}$) | $V_{90}$ (V) | $\Delta Q_{SW}$ (%) |
|---|---|---|---|---|---|---|
| 103 | 80/15 | 0.2/0.8 | −3.6 3.1 | 58 | 4.6 | −53 |
| 104 | 80/15 | 2.0/−0.9 | −3.4 3.8 | 52 | 4.9 | −6 |
| 107 | 80/15 | 1.6/−.6 | −4.4 3.4 | 54 | 4.9 | 1 |
| 109 | 80/15 | 5.9/−2.7 | −3.8 2.5 | 60 | 4.1 | 1 |
| 110 | 80/15 | 24/−13 | −3.9 2.8 | 54 | 4.1 | 1 |
| 112 | 80/15 | 70/−40 | −3.4 3.2 | 51 | 4.4 | 2 |

Figure 6:
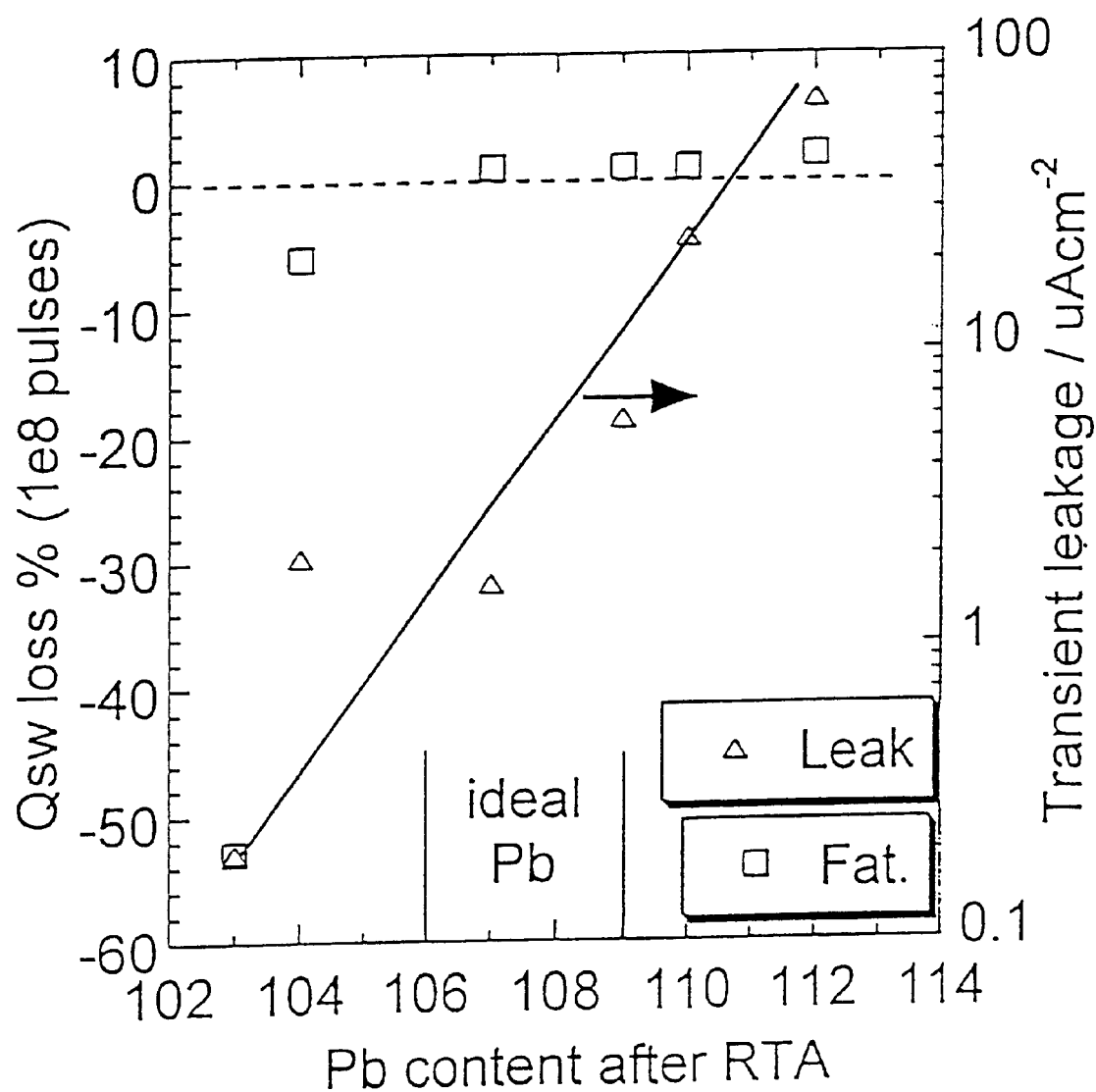

FIG. 6 shows the leakage current (for the case of +5V) and the fatigue $\Delta Q_{SW}$ represented in TABLE I after a thermal annealing process conducted at 600° C.

Referring to FIG. 6, it can be seen that there occurs no substantial fatigue in the ferroelectric capacitor even when a repetition of the voltage pulses is conducted for $1\times10^8$ times, provided that the amount of Pb in the PZT film 33 is set to 107% or more of the PZT stoichiometric composition. On the other hand, FIG. 6 also shows that the leakage current through the PZT film 33 increases when the Pb content in the PZT film 33 is increased. Thus, the result of FIG. 6 indicates that the ideal fatigue characteristic is obtained when the Pb content in the PZT film 33 is set to fall in the range of 104–112%, more preferably in the range of 107–109%, in view of the allowable limit of the leakage current.

TABLE II below summarizes the relationship between the value of the switching electric charge $Q_{SW}$, the value of the 90%-saturation voltage $Vg_{90}$, the initial leakage current for the voltage of +5V and for the voltage of −5V, the breakdown voltage in which the short-circuit occurs in the ferroelectric capacitor, the fatigue $\Delta Q_{SW}$ (=$Q_{SWloss}$) after the $1\times10^8$ pulses, and the leakage current and the breakdown voltage after the fatigue test, wherein it can be seen that the thickness of the SrRuO$_3$ film, constituting the stacked upper electrode 34 together with the Pt film, is changed from 0 nm to 70 nm. In the experiment of TABLE II, a PLZT composition containing Pb with an amount of 111% with respect to the stoichiometric composition was used for the ferroelectric film 33.

$1\times10^8$ times in the case the upper electrode 34 is formed exclusively of Pt. On the other hand, TABLE II also indicates that the loss of $Q_{SW}$ or fatigue is reduced to merely −3% by interposing a film of SrRuO$_3$ between the Pt electrode film and the PZT film 33 with a thickness of only 5 nm. Further, the 90%-saturation voltage $V_{90}$ is reduced to 5.0V or less, as compared with the case in which the upper electrode 34 is formed of Pt alone, by merely interposing the SrRuO$_3$ film having a thickness of 5 nm, between the Pt electrode film and the PZT film 33. In the case the upper electrode 34 is formed of Pt, the value of $V_{90}$ should be about 6.0V. The degree of improvement is increased with increasing thickness of the SrRuO$_3$ film for both the switching electric charge $Q_{SW}$ and the 90%-saturation voltage $V_{90}$.

Figure 7:
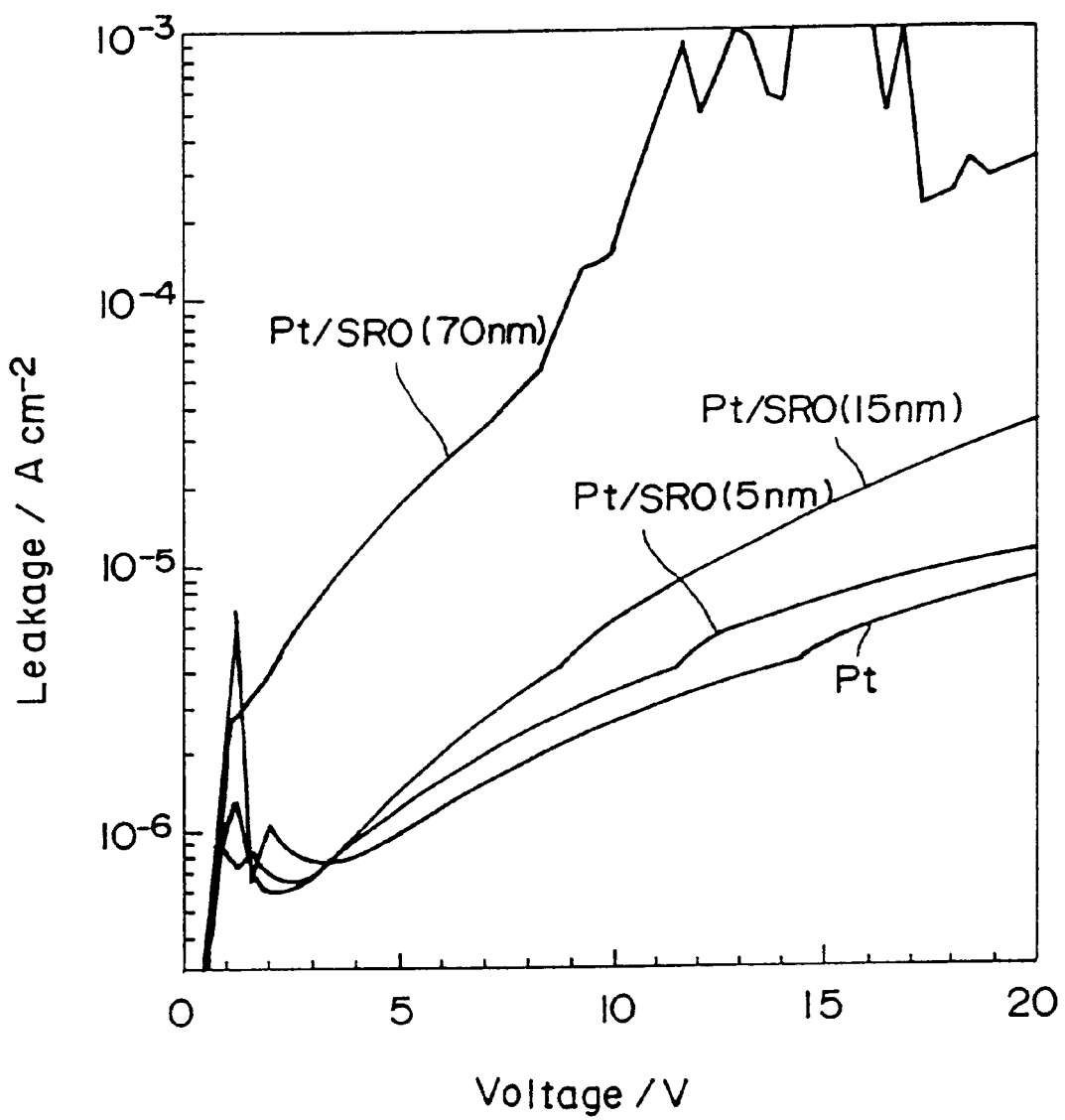

FIG. 7 shows the relationship between the initial leakage current represented in TABLE II and the applied voltage.

Referring to FIG. 7, the initial leakage current does not change much when the applied voltage is set to +5V and the SrRuO$_3$ film has a thickness in the range of 0–15 nm. When the thickness of the SrRuO$_3$ film has reached the value of 70 nm, on the other hand, it can be seen that the initial leakage current increases significantly. From this, it is concluded that the preferable thickness range of the SrRuO$_3$ for the upper electrode 34 is about 30 nm or less.

In the case the upper electrode 34 includes a SrRuO$_3$ film, the patterning of the upper electrode 34 is conducted by a plasma etching process using a mixture of Cl, O$_2$ and Ar as a plasma etching gas. However, due to the effect of Sr contained in the electrode 34, it is difficult in such a plasma etching process to obtain a sufficient etching rate. More specifically, the reaction between plasma and Sr becomes the bottle-neck of the plasma etching process. Thus, in order to obtain a large etching rate in such an electrode 34 containing a SrRuO$_3$ film, it is necessary to reduce the thickness of the SrRuO$_3$ film as much as possible.

TABLE III below represents the relationship between the annealing temperature of the ferroelectric capacitor and the switching electric charge $Q_{SW}$, the 90%-saturation voltage $V_{90}$, the leakage current under the electric field of 200 kVcm$^{-1}$, and the loss of $Q_{SW}$ after $1\times10^8$ pulses ($\Delta Q_{SW}$), all for the ferroelectric capacitor. In the experiment of TABLE III, it should be noted that a PLZT film having a thickness of 300 nm is used for the ferroelectric capacitor insulation film 33. Further, TABLE III lists the examples for the case in which the upper electrode 34 is formed of a Pt film having a thickness of 100 nm and for the case in which a SrRuO$_3$ film is interposed between the PLZT film 33 and the Pt electrode 34 with the thicknesses of 5 nm, 15 nm and 30 nm.

TABLE II

| $Q_{SW}$ ($\mu Ccm^{-2}$) | V90 (V) | leak(initial) +5 V/−5 V ($\mu Acm^{-2}$) | short (V) | $\Delta Q_{SW}$ (%) | leak(end) +5 V/−5 V ($\mu Acm^{-2}$) | short (V) | SRO thick (nm) |
|---|---|---|---|---|---|---|---|
| 52.6 | 6.0 | 1.0/0.3 | — | | | | 0 |
| 56.8 | 6.0 | | | −91 | 0.2/0.9 | | 0 |
| 59.4 | 4.8 | 1.2/0.2 | — | | | | 5 |
| 61.5 | 5.0 | | | −3 | 1.6/0.2 | | 5 |
| 56.6 | 4.0 | 1.4/0.31 | — | | | | 15 |
| 56.4 | 4.0 | | | −1 | 1.1/0.27 | | 15 |
| 54.7 | 4.0 | 17/0.9 | — | | | | 15 |
| 54.1 | 4.3 | 28/20 | — | 1 | 50/30 | −10 | 70 |

Referring to TABLE II, there occurs a loss of $Q_{SW}$ of as much as 91% after application of the voltage pulses for

TABLE III

| TEL thick (nm) | TEL ANNEAL (° C.) | Pb-Cont. (%) | $Q_{SW}$ ($\mu Ccm^{-2}$) | $V_{90}$ (V) | Leakage 200kVcm$^{-1}$ ($\mu Acm^{-2}$) | $\Delta Q_{SW}$ (%) |
|---|---|---|---|---|---|---|
| Pt(100) | 600 | 107 | 59 | 4.8 | 0.1 | −92 |
| Pt(100) | 650 | 107 | 66 | 4.1 | 0.2 | −38 |
| Pt(100) | 600 | 108 | 59 | 4.3 | 0.2 | −56 |
| Pt(100) | 650 | 108 | 64 | 3.4 | 0.15 | −34 |
| Pt(100) | 600 | 109 | 60 | 4.2 | 0.5 | −43 |
| Pt(100) | 650 | 109 | 62 | 3.2 | 1.5 | −27 |
| Pt/SRO(5) | 600 | 107 | 66 | 3.3 | 0.26 | 0 |
| Pt/SRO(5) | 650 | 107 | 63 | 3.1 | 0.26 | −7 |
| Pt/SRO (15) | 600 | 107 | 67 | 2.5 | 0.67 | 1 |
| Pt/SRO (15) | 650 | 107 | 65 | 2.4 | 0.58 | −5 |

TABLE III-continued

| TEL thick (nm) | TEL ANNEAL (° C.) | Pb-Cont. (%) | $Q_{SW}$ ($\mu Ccm^{-2}$) | $V_{90}$ (V) | Leakage 200kVcm$^{-1}$ ($\mu Acm^{-2}$) | $\Delta Q_{SW}$ (%) |
|---|---|---|---|---|---|---|
| Pt/SRO (30) | 600 | 107 | 70 | 3.7 | 0.5 | 1 |
| Pt/SRO (30) | 650 | 107 | 69 | 2.3 | 0.5 | −3 |

Referring to TABLE III, it can be seen that the fatigue $\Delta Q_{SW}$ can be reduced substantially by increasing the annealing temperature from 600° C. to 650° C. for the case in which the PZT film 33 contains Pb with a proportion of 108% or more as compared with the stoichiometric composition of PZT. While the exact reason of such a large change of the fatigue characteristic $\Delta Q_{SW}$ in the temperature range of only 50° C. is not well understood as the moment, it is possible that the use of the higher annealing temperature contributes to restore the damages caused in the PZT film 33 at the time of sputtering of the Pt electrode 34.

In the case where the SrRuO$_3$ film is interposed between the Pt electrode 34 and the underlying PZT film 33, no substantial change was observed with regard to the fatigue characteristic $\Delta Q_{SW}$ between the case in which the thermal annealing process is conducted at 600° C. and the case in which the thermal annealing process is conducted at 650° C.

TABLE IV below summarizes the relationship between the leakage current under the electric field of 200 kVcm$^{-1}$, inversion electric charges $Q_{SW}$, 90%-saturation voltage $V_{90}$ and the fatigue $\Delta Q_{SW}$ indicative of the change of the switching electric charges $Q_{SW}$ after repeating a pulse for 1×10$^8$ times.

TABLE IV

| TEL thick (nm) | PLZT thick d (nm) | TEL ANNEAL (° C.) | Leakage 200kVcm$^{-1}$ ($\mu Acm^{-2}$) | $Q_{SW}$ (@3 V) ($\mu Ccm^{-2}$) | V90 (V) | $\Delta Q_{SW}$ @1 × 10$^8$ (%) |
|---|---|---|---|---|---|---|
| Pt/SRO (10) | 150 | 600 | 2.20 | 55 | 2.7 | −3 |
| Pt/SRO (10) | 150 | 650 | 1.10 | 46 | 2.7 | 0 |
| Pt | 150 | 600 | 2.90 | 41 | 4.0 | −95 |
| Pt/SRO (10) | 175 | 600 | 0.80 | 53 | 3.6 | −2 |
| Pt/SRO (10) | 175 | 600 | 0.80 | 46 | 3.6 | −2 |
| Pt | 175 | 600 | 0.60 | 42 | 4.0 | −94 |

Referring to TABLE IV, in which a comparison is made between the case where the thickness of the PLZT film is set to 150 nm and the case where the thickness of the PLZT film is set to 175 nm, it can be seen that there are examples, in both of the foregoing two cases, in which the magnitude of the switching electric charge $Q_{SW}$ at the voltage of 3V exceeds 50·cm$^{-2}$, wherein these examples are obtained when the Pt electrode is formed on a SrRuO$_3$ film having a thickness of 10 nm. It should be noted that this value of $Q_{SW}$ is larger than the case in which the upper electrode 34 is formed of Pt alone. Such a ferroelectric capacitor having a thin ferroelectric film is useful in future semiconductor integrated circuits that are driven by a low driving voltage.

From TABLE IV, it can be seen that the leakage current generally increases with decreasing thickness of the ferroelectric capacitor insulation film. On the other hand, TABLE IV also represents that, as long as the thickness of the PLZT film is the same, there is no material difference in the leakage current between the case in which the Pt film only is provided for the upper electrode and the case in which the Pt film is formed on the SrRuO$_3$ film in the upper electrode.

Figure 8:
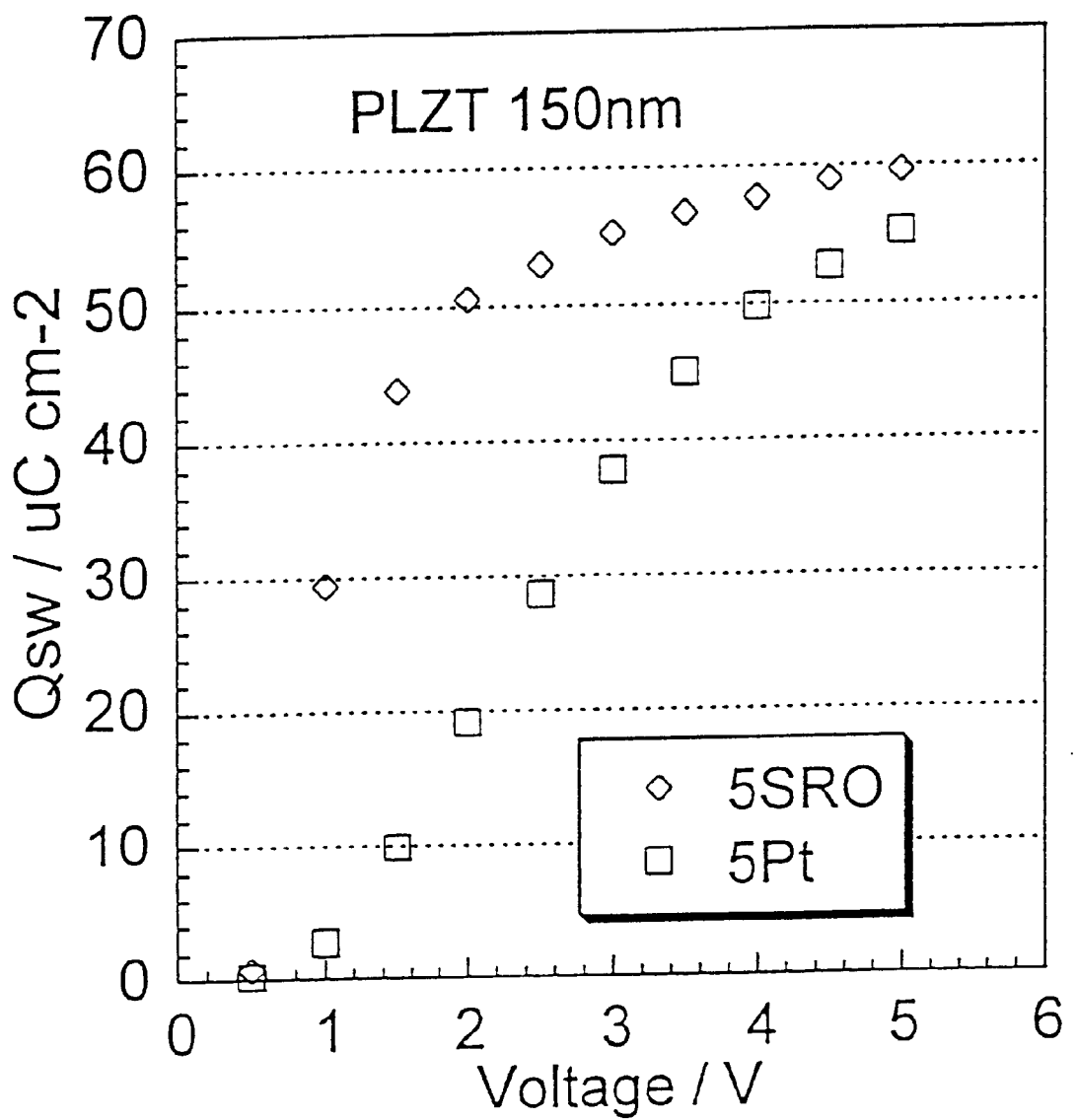

FIG. 8 shows the relationship between the switching electric charge $Q_{SW}$ of the PLZT film and the applied voltage for the case in which the PLZT film constituting the ferroelectric capacitor insulation film has a thickness of 150 nm.

Referring to FIG. 8, it can be seen that the value of the inversion electric charges $Q_{SW}$ becomes significantly larger in the case when a SrRuO$_3$ film is formed on the PLZT film 33 with a thickness of 5 nm and the Pt film is formed further thereon with a thickness of 5 nm, as compared with the case in which such a SrRuO$_3$ film is omitted.

Figure 9:
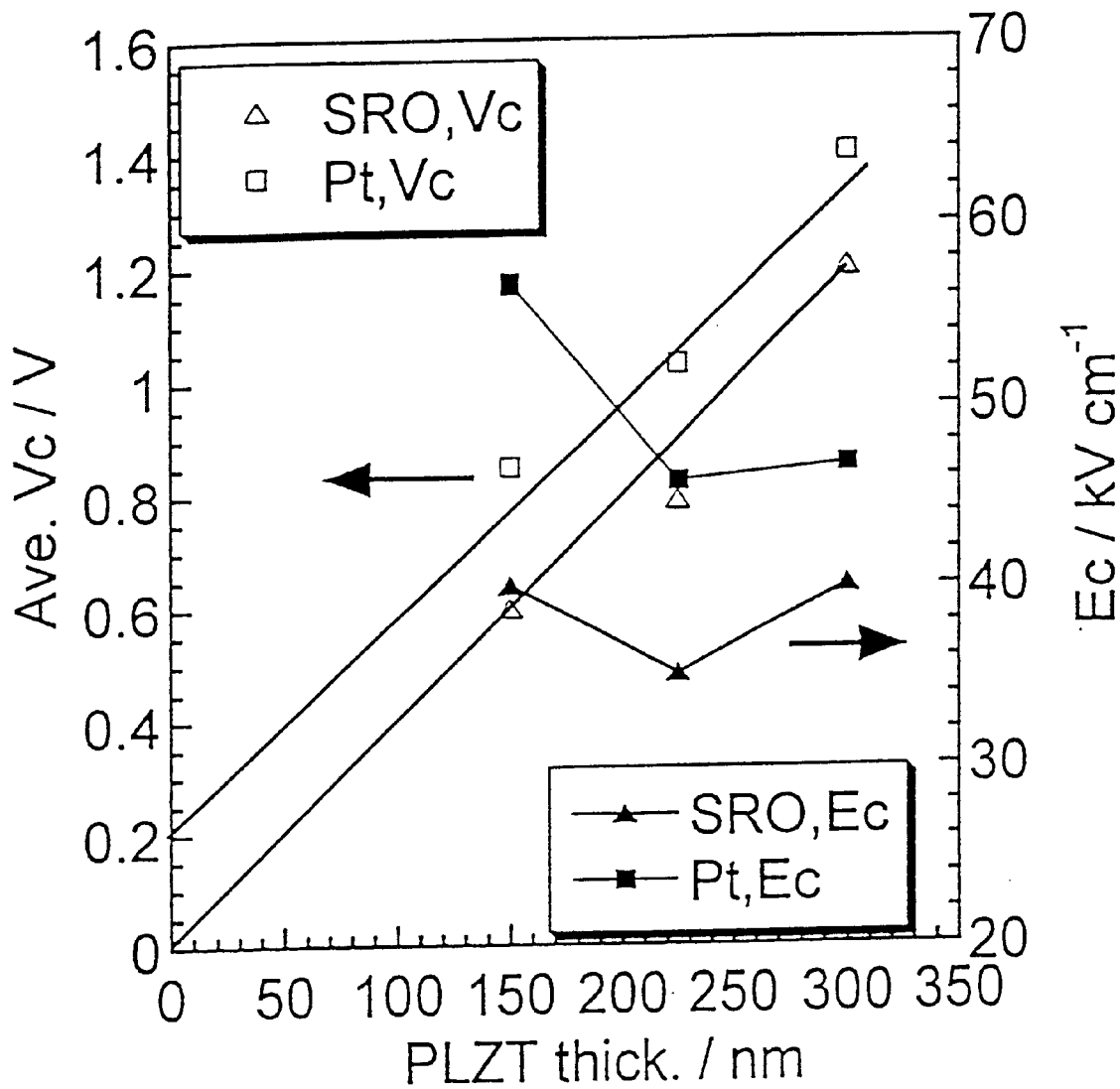

FIG. 9 shows the relationship between the coercive electric field voltage $V_c$ of the ferroelectric capacitor of FIG. 5 and the thickness of the PLZT film 33.

Referring to FIG. 9, the coercive voltage $V_c$ corresponding to the coercive electric field of the ferroelectric material decreases with increasing thickness of the PLZT film 33. Thus, by using such a PLZT film having a reduced thickness in a ferroelectric capacitor as the ferroelectric capacitor insulation film, it becomes possible to decrease the operational voltage of the semiconductor device that uses the ferroelectric capacitor. In this case, too, the coercive voltage is reduced by using a stacked structure of the SrRuO$_3$ film and the Pt electrode thereon.

FIG. 9 shows the relationship between the thickness of the PLZT film 33 and the coercive electric field $E_c$.

Referring to FIG. 9, it can be seen that the coercive electric field $E_c$ does not change substantially as long as the annealing process of the PLZT film 33 is conducted at about 600° C. In terms of the coercive voltage $V_c$, the magnitude of the voltage $V_c$ is reduced substantially by using the stacked structure of the SrRuO$_3$ layer and the Pt film as the upper electrode 34 as compared with the case in which the Pt film alone is used for the upper electrode 34.

[First Embodiment]

FIGS. 10A–10G represents the fabrication process of an FeRAM 40 according to an embodiment of the present invention.

Figure 10A:
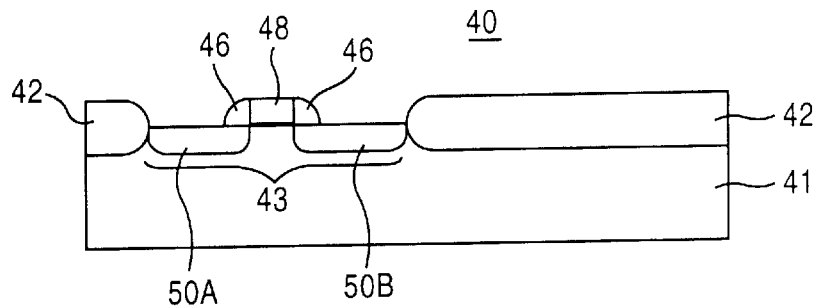
FIG. 10A–10G are diagrams showing the fabrication process of an FeRAM according to an embodiment of the present invention.

Referring to FIG. 10A, the FeRAM 40 is constructed on a Si substrate 41 carrying a device isolation structure 42 thereon, wherein the device isolation structure 42 is formed of a field oxide film defining a device region 43, and a gate electrode 48, carrying a pair of side wall insulation films 46 on both lateral sides thereof, is formed on the device region 43. Further, diffusion regions 50A and 50B are formed in the Si substrate at both lateral sides of the gate electrode 48.

Figure 10B:
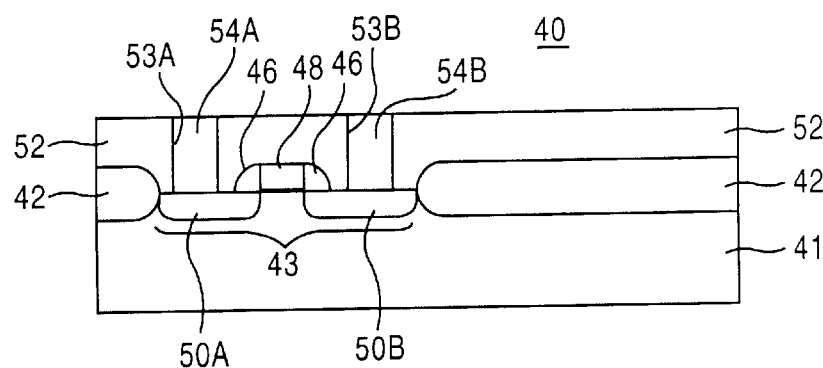

Next, in the step of FIG. 10B, an interlayer insulation film 52 is formed on the Si substrate 41 so as to cover the gate electrode 48 with a thickness of about 600 nm, and contact holes 53A and 53B are formed in the interlayer insulation film 52 so as to expose the diffusion regions 50A and 50B. The contact holes 53A and 53B are filled with conductive plugs 54A and 54B, respectively.

Figure 10C:
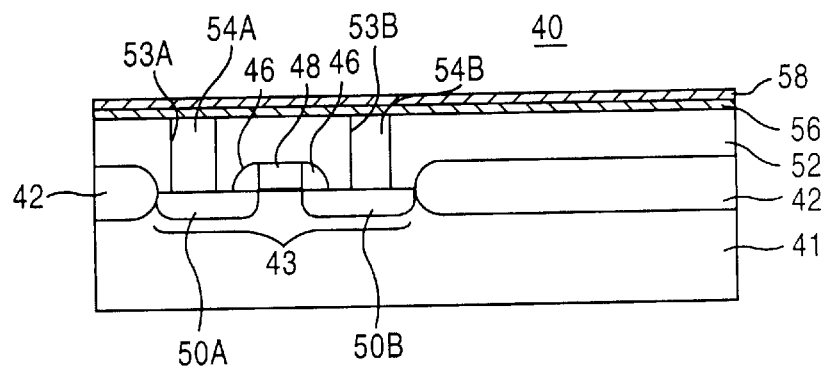

Next, in the step of FIG. 10C, an etching stopper film 56 of SiON and an SiO$_2$ film 58 are formed on the interlayer insulation film 52 with respective thicknesses of about 100 nm. Next, in the step of FIG. 10D, an iridium oxide film 60 having a composition represented as IrO$_x$, and a Pt film 64 are deposited consecutively on the SiO$_2$ film 58 by a sputtering process with respective thicknesses of 20–100 nm and 50–200 nm. As a result, a lower electrode layer 66 having a Pt/IrO$_x$ structure is formed. The deposition of the IrO$_x$ film 60 is conducted typically by a reactive sputtering process using Ir as a target. More specifically, the sputtering of the IrO$_x$ film 60 is achieved in a parallel-plate magnetron sputtering process in which a mixed gas plasma of Ar and O$_2$ is formed under a pressure of about 0.7 Pa, while supplying a D.C. plasma power of 0.5–5.0 W·cm$^{-2}$. In the sputtering process, the Ar gas and the O$_2$ gas are supplied to the processing chamber of the sputtering apparatus with respective flow-rates of about 100 SCCM and about 100 SCCM.

Figure 10D:
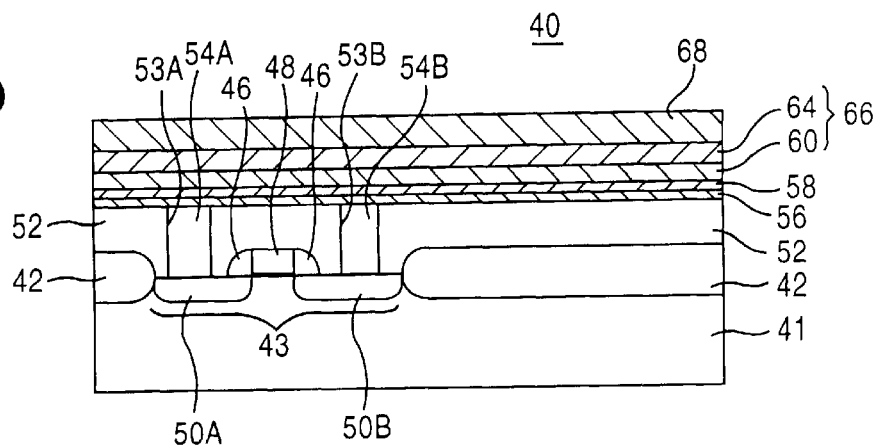

Next, in the step of FIG. 10D, a PZT film 68 is formed on the lower electrode layer 66 by a sputtering process or the CSD process, followed by a thermal annealing process conducted at the temperature of 550–750° C. in an oxidizing atmosphere. As a result of such a thermal annealing process, the PZT film 68 undergoes crystallization into the perovskite structure. In the present invention, it should be noted that the Pb content (=Pb/(Zr+Ti)) in the PZT film 68 is controlled so as to fall in the range of 104–112%, preferably in the range of 107–109%, in view of the relationship of TABLE I and FIG. 6 explained previously.

Figure 10E:
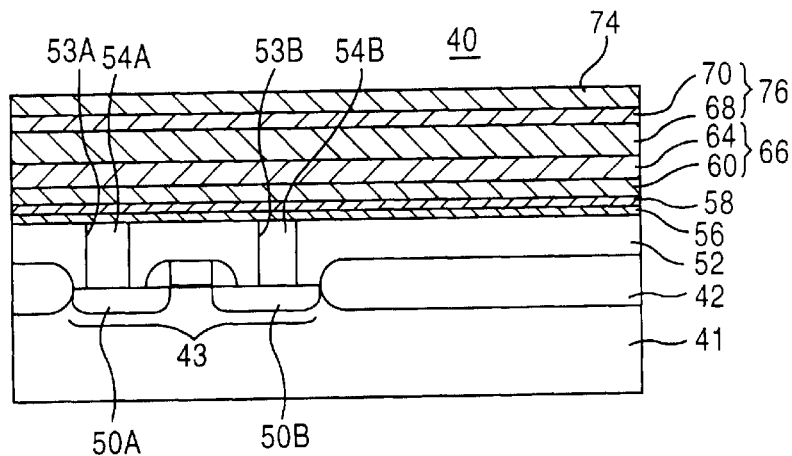

Next, in the step of FIG. 10E, a film 70 of SrRuO$_3$ is formed on the PZT film 68 by a sputtering process with a thickness of 5–30 nm while using a target of sintered SrRuO$_3$. Further, a Pt film 74 is deposited on the SrRuO$_3$ film 70 thus formed by a sputtering process similarly to the Pt film 64 with a thickness of 80–100 nm. As a result, an upper electrode layer 76 including the SrRuO$_3$ film 70 and the Pt film 74 is formed.

In the present invention, the structure thus obtained is subjected to a thermal annealing process conducted in an oxidizing atmosphere at the temperature between 600–650° C., preferably at about 600° C., such that the SrRuO$_3$ film 70 undergoes crystallization into the perovskite structure. Thereby, the composition of the SrRuO$_3$ film, represented as Sr$_x$RuO$_3$, can be adjusted such that the compositional parameter x falls in the range between 1.0 and 1.25. The sputtering process used for forming the SrRuO$_3$ film 70 may be any D.C. sputtering process or R.F. sputtering process and is conducted in a mixed gas plasma of Ar and O$_2$ under a pressure of 0.5–4.0 Pa while setting the power density to 0.3–3.0 Wcm$^{-2}$. Thereby, the Ar gas and the O$_2$ gas may be supplied with a flow-rate ratio of 100:0–50:50. A sintered body of SrRuO$_3$ having a relative density of 50–99% may be used for the sputtering target of SrRuO$_3$.

Figure 10F:
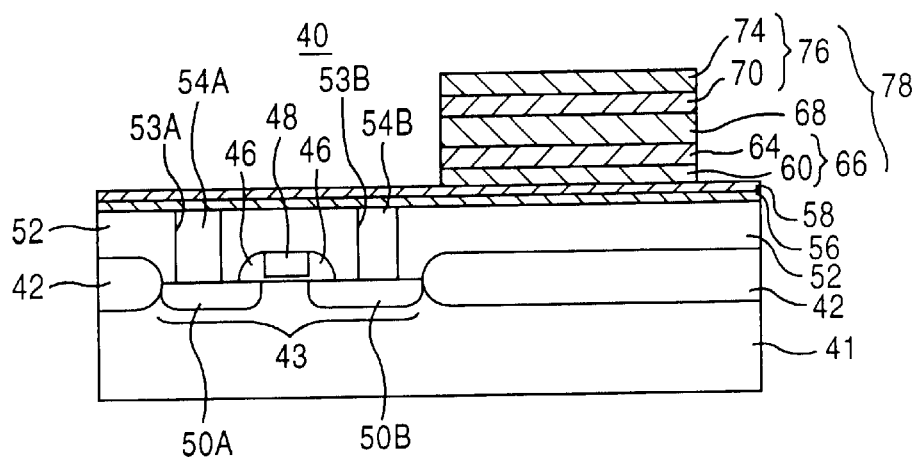

Next, in the step of FIG. 10F, the lower electrode layer 66, the PZT film 68, and the upper electrode layer 76 are subjected to a patterning process conducted by a dry-etching process that uses an etching gas mixture of Ar, Cl$_2$ and O$_2$. As a result of the dry-etching process, a ferroelectric capacitor 78 is formed.

During the process of FIG. 10F for patterning the lower electrode layer 66, the PZT film 68 and the upper electrode layer 76, it should be noted that the dry-etching process of the SrRuO$_3$ film 70 tends to become the bottle neck process. However, due to the very small thickness of the SrRuO$_3$ film 70 of 30 nm or less, a satisfactory overall throughput is obtained in the step of FIG. 10F. Further, because of the very small thickness of the SrRuO$_3$ film of about 30 nm or less, the ferroelectric film 70 undergoes a satisfactory crystallization even when the thermal annealing process is conducted at a low temperature of about 600° C.

Figure 10G:
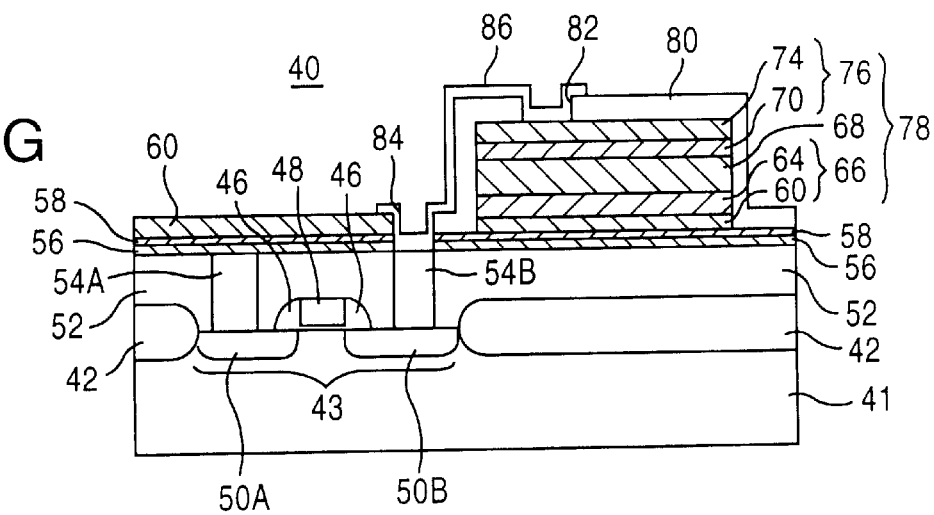

After the formation of the ferroelectric capacitor 78, an SiO$_2$ film 80 is deposited, shown in the step of FIG. 10G, on the SiO$_2$ film 58 such that the SiO$_2$ film 80 covers the top surface and the circumferential wall of the ferroelectric capacitor 78. Further, a contact hole 82 is formed in the SiO$_2$ film 80 so as to expose the Pt film 74 constituting a part of the top electrode 76. Further, another contact hole 84 is formed in the SiO$_2$ film 80 so as to expose the conductive plug 54B, and a local interconnection pattern 86 is formed on the SiO$_2$ film 80 by a deposition and patterning of a TiN film, such that the interconnection pattern 86 makes a contact with the Pt film 74 at the contact hole 82 and a further contact with the diffusion region 50B via the conductive plug 54B in the contact hole 84.

Finally, an interlayer insulation film (not shown) is deposited on the SiO$_2$ film 80 so as to cover the local interconnection pattern 86, and a contact hole (not shown) is formed in the foregoing interlayer insulation film so as to expose the conductive plug 54A. Further, a bit line electrode (not shown) is formed such that the bit line electrode makes a contact with the conductive plug 54A.

According to the present embodiment, the fatigue characteristic ($\Delta Q_{SW}$) of the ferroelectric capacitor 78 is improved substantially according to the relationship of TABLE I and FIG. 6, due to the optimization of the Pb content in the PZT film 68. Further, by optimizing the thickness of the SrRuO$_3$ film 70 in the upper electrode 76, the leakage characteristic of the ferroelectric capacitor 78 is improved as is demonstrated in FIG. 7.

Further, by conducting the thermal annealing process of the SrRuO$_3$ film 70 in the upper electrode 76 in the temperature range of 600–650° C., the fatigue characteristic of the ferroelectric capacitor 78 is improved as explained with reference to TABLE III. Particularly, in the case the SrRuO$_3$ film 70 is omitted from the upper electrode 76, the fatigue characteristic is improved by setting the foregoing annealing temperature to about 650° C., as explained with reference to TABLE III.

Further, the value of the 90%-saturation voltage $V_{90}$ is reduced in the FeRAM 40 of FIG. 10G, by setting the thickness of the PZT film 68 to be equal to 175 nm or 150 nm. Thereby, a low driving voltage, such as 3.3V, becomes possible in the FeRAM 40.

Further, the present invention is not limited to the embodiments described heretofore, but various variations and modifications may be made without departing from the scope of the invention.

What is claimed is:

1. A ferroelectric capacitor, comprising:
   a lower electrode;
   a ferroelectric capacitor insulation film having a perovskite structure provided on said lower electrode, said ferroelectric capacitor insulation film containing therein Pb, Zr and Ti; and
   wherein said ferroelectric capacitor insulation film contains an excess amount of Pb with respect to a stoichiometry composition of said ferroelectric capacitor insulation film.

2. A ferroelectric capacitor as claimed in claim 1, wherein said ferroelectric capacitor insulation film contains Pb, in terms of a Pb/(Zr+Ti) ratio, of about 1.04–1.12.

3. A ferroelectric capacitor as claimed in claim 1, wherein said ferroelectric capacitor insulation film contains Pb, in terms of a Pb/(Zr+Ti) ratio, of about 1.07–1.09.

4. A ferroelectric capacitor, comprising:
   a lower electrode;
   a ferroelectric capacitor insulation film having a perovskite structure provided on said lower electrode, said ferroelectric capacitor insulation film containing Pb, Zr and Ti, said ferroelectric capacitor insulation film containing an excess amount of Pb in comparison to a stoichiometric composition of PZT;

a conductive oxide layer having a perovskite structure provided on said ferroelectric capacitor insulation film; and said ferroelectric capacitor insulation film having a thickness of about 300 nm or less.

5. A semiconductor device, comprising:

a substrate;

an active element formed on said substrate; and a ferroelectric capacitor formed on said substrate in electrical connection with said active element, said ferroelectric capacitor comprising:

a lower electrode;

a ferroelectric capacitor insulation film having a perovskite structure provided on said lower electrode, said ferroelectric capacitor insulation film containing therein Pb, Zr and Ti; and an upper electrode provided on said ferroelectric capacitor insulation film, said upper electrode including a conductive oxide layer having a perovskite structure, wherein said ferroelectric capacitor insulation film contains an excess amount of Pb with respect to a stoichiometry composition of said ferroelectric capacitor insulation film.

6. A semiconductor device as claimed in claim 5, wherein said ferroelectric capacitor insulation film contains Pb, in terms of a Pb/(Zr+Ti) ratio, of about 1.04–1.12.

7. A semiconductor device as claimed in claim 5, wherein said ferroelectric capacitor insulation film contains Pb, in terms of a Pb/(Zr+Ti) ratio, of about 1.07–1.09.

8. A semiconductor device, comprising:

a substrate;

an active element formed on said substrate; and a ferroelectric capacitor formed on said substrate in electrical connection with said active element, said ferroelectric capacitor comprising;

a lower electrode;

a ferroelectric capacitor insulation film having a perovskite structure provided on said lower electrode, said ferroelectric capacitor insulation film containing Pb, Zr and Ti, said ferroelectric capacitor insulation film containing an excess amount of Pb in comparison to a stoichiometric composition of PZT;

a conductive oxide layer having a perovskite structure provided on said ferroelectric capacitor insulation film; and an upper electrode provided on said conductive oxide layer;

said ferroelectric capacitor insulation film having a thickness of about 300 nm or less.

* * * * *